(12) United States Patent
Kurita et al.

(10) Patent No.: US 7,960,249 B2
(45) Date of Patent: Jun. 14, 2011

(54) METHOD FOR PRODUCING WAFER FOR BACKSIDE ILLUMINATION TYPE SOLID IMAGING DEVICE

(75) Inventors: Kazunari Kurita, Minato-ku (JP); Shuichi Omote, Minato-ku (JP)

(73) Assignee: Sumco Corporation, Minato-ku, Tokyo (JP)

( * ) Notice: Subject to any disclaimer, the term of this patent is extended or adjusted under 35 U.S.C. 154(b) by 91 days.

(21) Appl. No.: 12/553,353

(22) Filed: Sep. 3, 2009

(65) Prior Publication Data

US 2010/0062584 A1 Mar. 11, 2010

(30) Foreign Application Priority Data

Sep. 5, 2008 (JP) ................... 2008-227965

(51) Int. Cl.
*H01L 21/30* (2006.01)
(52) U.S. Cl. ................. 438/459; 438/455; 257/E21.122; 257/E21.567
(58) Field of Classification Search .................. 438/455, 438/459; 257/E21.122, E21.567
See application file for complete search history.

(56) References Cited

U.S. PATENT DOCUMENTS

| 7,262,486 B2 * | 8/2007 | Kawano et al. ............... 257/621 |
| 2002/0173118 A1 * | 11/2002 | Dietrich et al. ............... 438/455 |
| 2009/0309190 A1 * | 12/2009 | Nevin et al. .................... 257/616 |

FOREIGN PATENT DOCUMENTS

| JP | 4-304653 A | 10/1992 |
| JP | 2007-013089 A | 1/2007 |
| JP | 2007-059755 A | 3/2007 |
| KR | 200180335 A | 8/2001 |

OTHER PUBLICATIONS

Notice to File a Response mailed Mar. 9, 2011, issued in corresponding Korean Application No. 10-2009-0083990, filed Jul. 9, 2007, 6 pages.

* cited by examiner

*Primary Examiner* — Ha Tran T Nguyen
*Assistant Examiner* — Aaron A Dehne
(74) *Attorney, Agent, or Firm* — Christensen O'Connor Johnson Kindness PLLC

(57) ABSTRACT

A wafer for backside illumination type solid imaging device having a plurality of pixels inclusive of a photoelectric conversion device and a charge transfer transistor at its front surface side and a light receiving surface at its back surface side is produced by a method comprising a step of forming a BOX oxide layer on at least one of a wafer for support substrate and a wafer for active layer, a step of bonding the wafer for support substrate and the wafer for active layer and a step of thinning the wafer for active layer, which further comprises a step of forming a plurality of concave portions on a bonding face of the BOX oxide layer to the other wafer and filling a polysilicon plug into each of the concave portions to form a composite layer before the step of bonding the wafer for support substrate and the wafer for active layer.

9 Claims, 2 Drawing Sheets

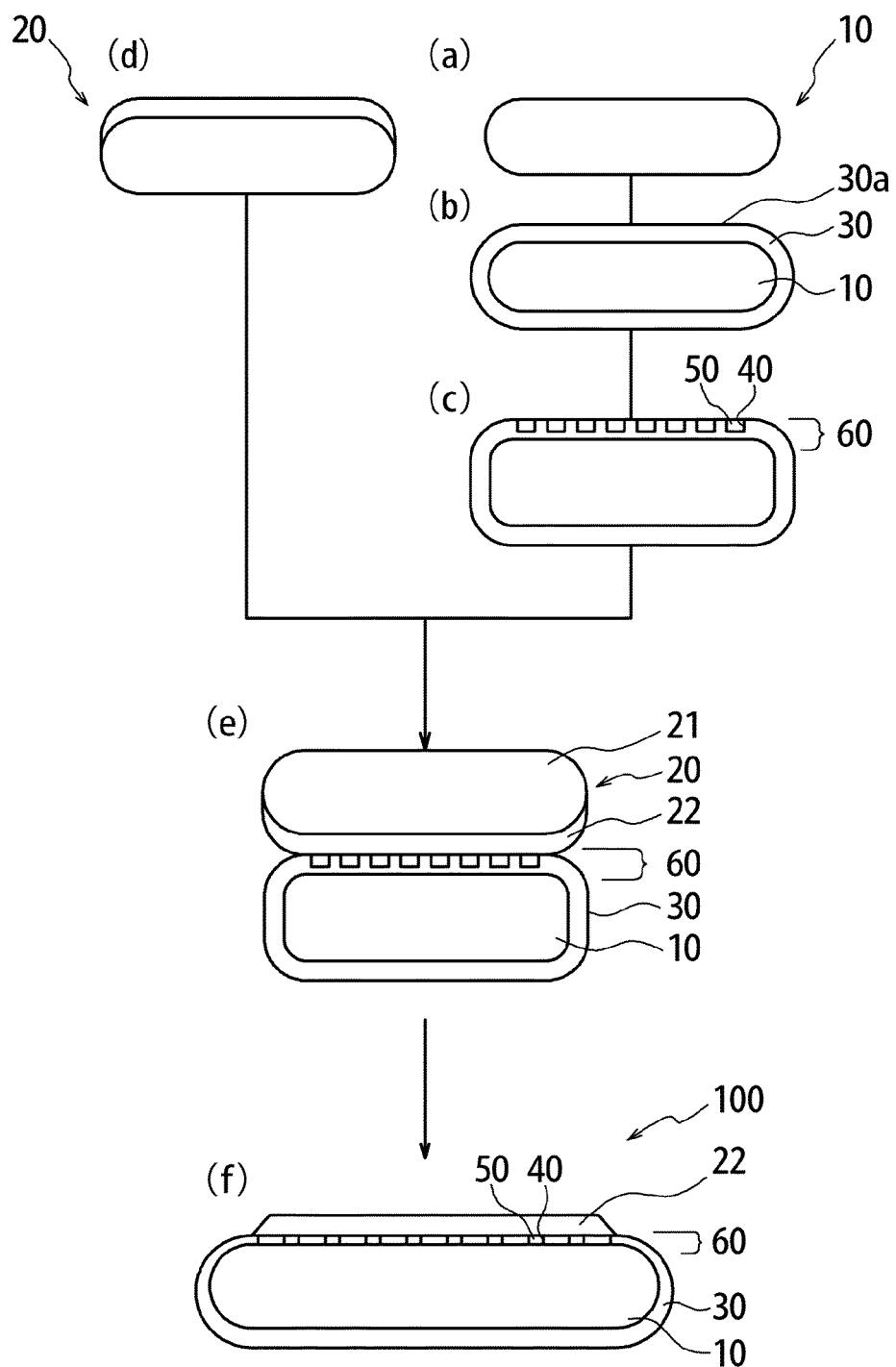

METHOD FOR PRODUCING WAFER FOR BACKSIDE ILLUMINATION TYPE SOLID IMAGING DEVICE

BACKGROUND

1. Field of the Invention

This invention relates to a method for producing a wafer for backside illumination type solid imaging device, and more particularly to a method for producing a wafer for backside illumination type solid imaging device used in mobile phones, digital video cameras and the like.

2. Description of the Related Art

Recently, a high-performance solid imaging device using a semiconductor is mounted onto a mobile phone, a digital video camera or the like. As the performance to be required in the solid imaging device are high-quality pixels and ability of taking moving images, and in order to take moving images, it is required to combine a high-speed computing device with a memory device, and hence a CMOS image sensor allowing System on Chip (SoC) easily is used and the downsizing of the CMOS image sensor is developed.

With the downsizing of the CMOS image sensor, however, there is caused a problem that an aperture ratio of a photodiode as a photoelectric conversion device is necessarily reduced to lower a quantum efficiency of the photoelectric conversion device, which makes it difficult to improve S/N ratio of imaging data. Therefore, it is attempted to conduct a method for increasing incident light quantity by inserting an inner lens into a front side of the photoelectric conversion device, or the like. However, the remarkable improvement of S/N ratio can not be realized.

In order to increase the incident light quantity to improve the S/N ratio of the image data, therefore, it is attempted to feed the incident light from a backside of the photoelectric conversion device. The greatest merit of the light incidence from the backside of the device lies in a point that there is no restriction in the reflection or diffraction on the front face of the device or the light receiving area of the device as compared with the light incidence from the front side. On the other hand, when the light is entered from the backside, the light absorption through a silicon wafer as a substrate for the photoelectric conversion device must be suppressed, and hence the thickness of the solid imaging device as a whole is required to be less than 50 µm. As a result, the working and handling of the solid imaging device become difficult, causing a problem of extremely low productivity.

For the purpose of overcoming the above technical problems, there are mentioned backside illumination type solid imaging devices as disclosed, for example, in JP-A-2007-13089 and JP-A-2007-59755.

In JP-A-2007-13089 is disclosed a method for producing a solid imaging device, which allows the production of a backside illumination type CMOS solid imaging device having a structure that electrodes are taken out from a surface opposite to an illuminated surface relatively simply and easily since a semiconductor substrate is thinned after bonding with a support substrate to ensure a strength and a through-hole interconnection is formed after the thinning of the support substrate.

In JP-A-2007-59755 is disclosed a solid imaging apparatus wherein internal stress and strain of a semiconductor substrate can be made small but also the processing of a color filter, a micro-lens or the like onto a thinned surface of a semiconductor substrate can be conducted in a high accuracy as well as a production method thereof.

In the solid imaging devices of these patent documents, however, the gettering ability of the substrate (wafer) is low, so that there are problems that white defects occur and that heavy metal contamination occurs in the production process. Therefore, it is required to solve these problems in order to put the backside illumination type solid imaging device into practical use.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

It is, therefore, an object of the invention to provide a method for producing a wafer for backside illumination type solid imaging device, which is capable of effectively suppressing the occurrence of white defects and the heavy metal contamination.

In order to achieve the above object, the summary and construction of the invention are as follows.

(1) A method for producing a wafer for backside illumination type solid imaging device having a plurality of pixels inclusive of a photoelectric conversion device and a charge transfer transistor at its front surface side and a light receiving surface at its back surface side, comprising a step of forming a buried oxide (BOX) oxide layer on at least one of a wafer for support substrate and a wafer for active layer, a step of bonding the wafer for support substrate and the wafer for active layer, and a step of thinning the wafer for active layer, which further comprises a step of forming a plurality of concave portions on a bonding face of the BOX oxide layer to the other wafer and filling a polysilicon plug into each of the concave portions to form a composite layer before the step of bonding the wafer for support substrate and the wafer for active layer.

(2) The method according to the item (1), wherein a single oxide layer is existent between the composite layer and the other wafer.

(3) The method according to the item (1), wherein the wafer for support substrate is made of C-containing n-type semiconductor material.

(4) The method according to the item (1), wherein the wafer for active layer is an epitaxial wafer obtained by forming an epitaxial film of Si on a substrate for active layer made of n-type semiconductor layer.

(5) The method according to the item (3), wherein the wafer for support substrate has a C concentration of $1\times10^{16}$ to $1\times10^{17}$ atoms/cm$^3$.

(6) The method according to the item (1), which further comprises a step of forming a polysilicon film on a face opposite to the bonding face of at least one of the wafer for support substrate and the wafer for active layer before the step of forming the BOX oxide layer.

(7) The method according to the item (1), which further comprises a step of subjecting each of the wafers to a heat treatment at 600 to 800° C. before the step of forming the BOX oxide layer.

(8) The method according to the item (1), which further comprises a step of adsorbing a given organic substance onto the bonding face of the BOX oxide layer to the other wafer after the step of forming the BOX oxide layer and before the step of bonding the wafer for support substrate and the wafer for active layer.

(9) The method according to the item (8), wherein the organic substance is an organic carbon compound.

According to the production method of a wafer for backside illumination type solid imaging device of the invention, it is possible to provide a wafer for backside illumination type solid imaging device, which is capable of effectively suppressing the occurrence of white defects and the heavy metal contamination.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIG. 1 is a flow chart illustrating a method for producing a wafer for backside illumination type solid imaging device according to the invention;

DETAILED DESCRIPTION

While illustrative embodiments have been illustrated and described, it will be appreciated that various changes can be made therein without departing from the spirit and scope of the invention.

Figure 2A:
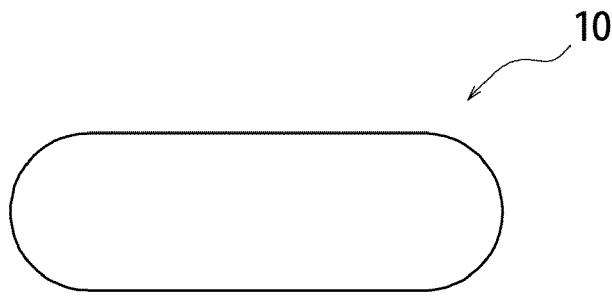
FIG. 2A is a schematic view showing a section of a wafer for support substrate.
Figure 2B:
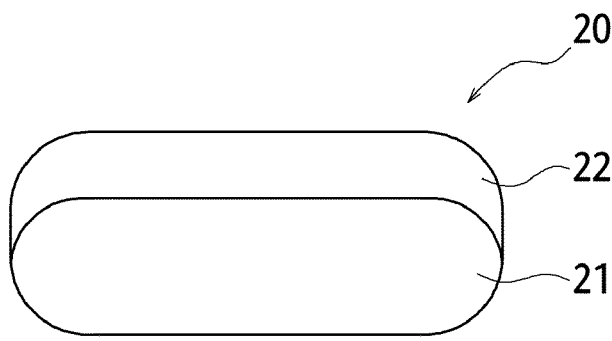
FIG. 2B is a schematic view showing a section of a wafer for active layer.
Figure 3A:
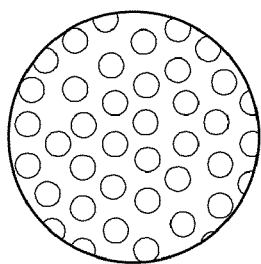
FIGS. 3A-3C are schematic views showing exemplary configurations of a polysilicon plug.
Figure 3B:
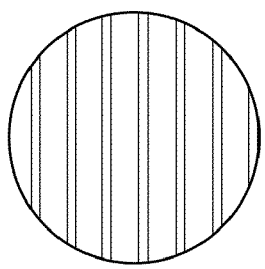
Figure 3C:
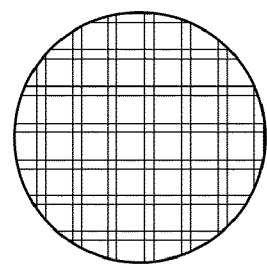

A method for producing a wafer for backside illumination type solid imaging device according to the invention will be described with reference to the drawings. FIG. 1 is a flow chart illustrating a method for producing a wafer for backside illumination type solid imaging device according to the invention, and FIGS. 2A and 2B are schematic views showing sections of a wafer for support substrate and a wafer for active layer, respectively, which are used in the method for producing a wafer for backside illumination type solid imaging device according to the invention. Also, FIGS. 3A-3C are schematic plan views showing exemplary configurations of a polysilicon plug shown in FIG. 1(c).

As shown in FIG. 1, the method for producing a wafer for backside illumination type solid imaging device according to the invention comprises a step (FIG. 1(b)) of forming a BOX oxide layer 30 on at least one of a wafer 10 for support substrate (FIG. 1(a)) and a wafer 20 for active layer (FIG. 1(d)), a step (FIG. 1(e)) of bonding the wafer 10 for support substrate and the wafer 20 for active layer and a step (FIG. 1(f)) of thinning the wafer 20 for active layer, and is characterized by further comprising a step (FIG. 1(c)) of forming a plurality of predetermined concave portions 40 on a bonding face 30a of the BOX oxide layer 30 to the other wafer and filling a polysilicon plug 50 in each of the concave portions 40 to form a composite layer 60 before the step of bonding the wafer 10 for support substrate and the wafer 20 for active layer. When a wafer 100 for backside illumination type solid imaging device (FIG. 1(f)) is formed by this method, the polysilicon plugs 50 serve as gettering sinks of heavy metal. When the wafer 100 is used in a backside illumination type solid imaging device, the occurrence of white defects and the heavy metal contamination can be effectively suppressed by gettering the heavy metal as compared to the conventional imaging device. As an example in FIG. 1, the BOX oxide layer 30 is formed only on the wafer 10 for support substrate, and the predetermined concave portions 40 are formed on the bonding face 30a of the BOX oxide layer 30 to the wafer 20 for active layer, and the polysilicon plug 50 is filled in each of the concave portions 40 to form the composite layer 60, which shows merely one embodiment of the invention. The BOX oxide layer 30 may be formed on the wafer 20 for active layer, or on both of the wafer 10 for support substrate and the wafer 20 for active layer.

(Wafer for Support Substrate)

The wafer 10 for support substrate shown in FIG. 2A is preferably made of a carbon (C)-containing n-type semiconductor material in view of strengthening the gettering ability and is preferable to have a specific resistance of 1 to 20Ω·cm.

Further, the C concentration of the wafer 10 for support substrate is preferable to be within a range of $1\times10^{16}$ to $1\times10^{17}$ atoms/cm$^3$. When the C concentration is less than $1\times10^{16}$ atoms/cm$^3$, the gettering ability can not be developed sufficiently and there is a fear that the white defects and heavy metal contamination can not be sufficiently suppressed, while when it exceeds $1\times10^{17}$ atoms/cm$^3$, the size of the oxygen precipitates is less than 50 nm and strain energy capable of gettering heavy metal can not be retained.

(Wafer for Active Layer)

The wafer 20 for active layer 20 is preferable to be an epitaxial wafer 20 obtained by forming an epitaxial film 22 of Si on a substrate 21 for active layer made of n-type semiconductor layer as shown in FIG. 2B. Also, the substrate 21 for active layer is preferable to contain C in view of strengthening the gettering ability and to have a specific resistance of 3 to 15Ω·cm. Since the epitaxial film 22 being less in the defects and having a high quality can be formed on the substrate 21 for active layer made of C-containing n-type semiconductor material by the gettering effect of the substrate 21 for active layer, when such an epitaxial film 22 is formed on the composite layer 60 to produce a solid imaging device, the effect of suppressing the occurrence of white defects and heavy metal contamination can be further improved.

Moreover, the C concentration of the substrate 21 for active layer is preferable to be within a range of $1\times10^{16}$ to $1\times10^{17}$ atoms/cm$^3$. When the C concentration is less than $1\times10^{16}$ atoms/cm$^3$ likewise the case of the wafer 10 for support substrate, the gettering ability can not be developed sufficiently and there is a fear that the white defects and heavy metal contamination generated in the epitaxial film 22 can not be sufficiently suppressed, while when it exceeds $1\times10^{17}$ atoms/cm$^3$, the size of the oxygen precipitates becomes minimal and it is difficult to retain strain energy required for the gettering and hence there is a fear that the gettering ability lowers.

Furthermore, when the wafer 10 for support substrate contains C, it is preferable that the contained C atoms are existent as a high carbon concentration region just beneath an interface with the composite layer 60. The high carbon concentration region means a region that the C concentration is locally large in the wafer 10 for support substrate. Since the high carbon concentration region effectively serves as a gettering sink, the effect of suppressing the occurrence of white defects and the heavy metal contamination can be further improved.

As a method of including a given amount of C into the wafer 10 for support substrate and the wafer 20 for active layer, there are mentioned a method of doping a silicon substrate with C atoms, an ion implantation method and so on. Also, O atoms can be included into the wafer 10 for support substrate and the wafer 20 for active layer. The inclusion of O atoms can effectively suppress the diffusion of the C atoms included for the gettering effect into the epitaxial film 22.

Although it is not shown, the production method according to the invention is preferable to further comprise a step of forming a polysilicon film on a face opposite to the bonding face of at least one of the wafer 10 for support substrate and the wafer 20 for active layer before the step of forming the BOX oxide layer. The formation of the polysilicon film is expected to further enhance the gettering effect since it serves as a gettering sink.

(Composite Layer)

The BOX oxide layer 30 is preferably formed by wet oxidation. In this case, a dense film can be formed to form an interface suitable for bonding.

The concave portions 40 provided on the bonding face 30a of the BOX oxide layer 30 to the other wafer 20 are preferably formed by dry etching without passing through the BOX oxide layer 30. Thus, the shape accuracy of the concave portion is attained in a high precision. Also, the shape of the concave portion 40 can be an arbitrary shape, which may include, for example, an island shape (FIG. 3A), a line shape (FIG. 3B)), or a texture shape (FIG. 3C).

The polysilicon plug 50 filled in the concave portion 40 is formed by embedding polysilicon into the concave portion 40. The thickness d of the polysilicon plug 50 is preferable to be 50 to 70% of a thickness D of the composite layer 60. When the thickness d is less than 50%, there is a fear that the gettering ability of the polysilicon lowers, while when it exceeds 70%, the formation of polysilicon takes long time and the production efficiency lowers. Moreover, a total upper area s of the polysilicon plugs 50 is preferable to be 70 to 90% of an upper area S of the wafer 10 for support substrate. When the area s is less than 70%, there is a fear that the gettering ability lowers, while when it exceeds 90%, there is a fear that the bonding strength between the polysilicon plug and the substrate for active layer lowers.

The production method of a wafer for backside illumination type solid imaging device according to the invention is preferable to further comprise a step of subjecting each of the wafers 10 and 20 to a heat treatment at 600 to 800° C. before the step of forming the BOX oxide film. Since the oxygen precipitation is promoted by this heat treatment, it is possible to form high-density oxygen precipitates.

The production method of a wafer for backside illumination type solid imaging device according to the invention is preferable to further comprise a step of adsorbing a given organic substance on the bonding face of the BOX oxide layer 30 to the other wafer after the step of forming the BOX oxide layer 30 and before the step of bonding the wafer 10 for support substrate and the wafer 20 for active layer though it is not shown in FIG. 1. When bonding is conducted by adsorbing the organic substance on the bonding face, the organic substance forms a high carbon concentration region in the bonding interface by the heat treatment in the bonding, which is desired to further improve the gettering ability in the wafer 100 for backside illumination type solid imaging device according to the invention.

The organic substance is preferable to be an organic carbon compound such as N-methyl pyrrolidone, polyvinyl pyrrolidone or the like. By using such an organic carbon compound can be simply conducted the formation of the high carbon concentration region.

The production method of a wafer for backside illumination type solid imaging device according to the invention is preferable to have a single oxide layer between the composite layer 60 and the other wafer though it is not shown in FIG. 1. This is for facilitating the separation of the polysilicon plugs 50 filled in the composite layer 60 from the wafer 20 for active layer.

Although the above is described with respect to only one embodiment of the invention, various modifications may be made without departing from the scope of the appended claims.

Next, a wafer for backside illumination type solid imaging device according to the invention is prepared as a sample and its performances are evaluated as described below.

Example 1

As shown in FIGS. 1, 2A, and 2B, a BOX oxide layer 30 (FIG. 1(b)) is formed on a wafer 10 for support substrate (FIG. 1(a) and FIG. 2A) by wet oxidation, and a plurality of columnar concave portions 40 are formed in the BOX oxide layer 30 by dry etching, and a polysilicon plug is filled in each of these concave portions 40 by a CVD method to form a composite layer (FIG. 1(c)). On the other hand, there is provided an epitaxial wafer prepared by forming an epitaxial film 22 of Si on a substrate 21 for active layer by the CVD method as a wafer 20 for active layer (FIG. 1(d) and FIG. 2B).

Thereafter, the wafer 10 for support substrate and the wafer 20 for active layer are bonded (FIG. 1(e)), and then the wafer 20 for active layer is thinned by polishing and chemical etching to prepare a wafer 100 for backside illumination type solid imaging device as a sample (FIG. 1(f)).

Example 2

A sample of a wafer for backside illumination type solid imaging device is prepared in the same manner as in Example 1 except that the thickness of the polysilicon plug is changed.

Example 3

A sample of a wafer for backside illumination type solid imaging device is prepared in the same manner as in Example 1 except that a total upper area of the polysilicon plugs is changed.

Example 4

A sample of a wafer for backside illumination type solid imaging device is produced in the same steps as in Example 2 except that a total upper area of the polysilicon plug is changed.

COMPARATIVE EXAMPLE 1

A sample of a wafer for backside illumination type solid imaging device is prepared in the same manner as in Example 1 except that the polysilicon plug 50 is not formed.

(Evaluation Method)

Each sample prepared in Examples 1 to 4 and Comparative Example 1 is evaluated by the following evaluation methods.

(1) White Defects

A backside illumination type solid imaging device is prepared by using each sample prepared in Examples 1-4 and Comparative Example 1, and thereafter the dark leakage current of a photodiode in the backside illumination type solid imaging device is measured and converted to pixel data (number data of white defects) with a semiconductor parameter analyzing apparatus, whereby the number of white defects per unit area (1 cm$^2$) is measured to evaluate the suppression on the occurrence of white defects. The evaluation standard is shown below, and the measured results and evaluation results are shown in Table 1.

⊚: not more than 5
○: more than 5 but not more than 50
X: more than 50

(2) Heavy Metal Contamination

A defect density (defects/cm$^2$) on the surface of the sample is measured by contaminating the sample surface with nickel ($1.0 \times 10^{12}$ atoms/cm$^2$) by a spin coat contaminating method and thereafter subjecting to a heat treatment at 900° C. for 1 hour and then selectively etching the sample surface. The evaluation standard is shown below, and the measured results and evaluation results are shown in Table 1.

⊚: less than 5
○: not less than 5 but less than 50
X: not less than 50

TABLE 1

|  | Thickness of polysilicon plug d (Å) | Thickness of composite layer D (Å) | Total upper area of polysilicon plugs s (cm²) | Upper area of wafer for support substrate S (cm²) | Evaluation results | |
|---|---|---|---|---|---|---|
|  |  |  |  |  | White defect Evaluation | Heavy metal contamination Evaluation |
| Example 1 | 150 | 300 | 1130 | 1256 | ◎ | ◎ |
| Example 2 | 250 | 300 | 1130 | 1256 | ◎ | ◎ |
| Example 3 | 150 | 300 | 754 | 1256 | ○ | ○ |
| Example 4 | 250 | 300 | 754 | 1256 | ○ | ○ |
| Comparative Example 1 | 0 | 300 | 0 | 1256 | X | X |

As seen from the results of Table 1, Examples 1 to 4 can suppress the occurrence of white defects and heavy metal contamination as compared to Comparative Example 1.

According to the production method of a wafer for backside illumination type solid imaging device of the invention, it is possible to provide a wafer for backside illumination type solid imaging device capable of effectively suppressing the occurrence of white defects and heavy metal contamination.

The embodiments of the invention in which an exclusive property or privilege is claimed are defined as follows:

1. A method for producing a wafer for backside illumination type solid imaging device having a plurality of pixels inclusive of a photoelectric conversion device and a charge transfer transistor at its front surface side and a light receiving surface at its back surface side, comprising a step of forming a buried oxide (BOX) oxide layer on at least one of a wafer for support substrate and a wafer for active layer, a step of bonding the wafer for support substrate and the wafer for active layer and a step of thinning the wafer for active layer, which further comprises a step of forming a plurality of concave portions on a bonding face of the BOX oxide layer and filling a polysilicon plug into each of the concave portions to form a composite layer before the step of bonding the wafer for support substrate and the wafer for active layer.

2. The method according to claim 1, wherein a single oxide layer is existent between the composite layer and the other war.

3. The method according to claim 1, wherein the wafer for support substrate is made of C-containing n-type semiconductor material.

4. The method according to claim 1, wherein the wafer for active layer is an epitaxial wafer obtained by forming an epitaxial film of Si on a substrate for active layer made of n-type semiconductor layer.

5. The method according to claim 3, wherein the wafer for support substrate has a C concentration of $1\times10^{16}$ to $1\times10^{17}$ atoms/cm³.

6. The method according to claim 1, which further comprises a step of forming a polysilicon film on a face opposite to the bonding face of at least one of the wafer for support substrate and the wafer for active layer before the step of forming the BOX oxide layer.

7. The method according to claim 1, which further comprises a step of subjecting each of the wafers to a heat treatment at 600 to 800° C. before the step of forming the BOX oxide layer.

8. The method according to claim which further comprises a step of adsorbing a given organic substance onto the bonding face of the BOX oxide layer to the other wafer after the step of forming the BOX oxide layer and before the step of bonding the wafer for support substrate and the wafer for active layer.

9. The method according to claim 8, wherein the organic substance is an organic carbon compound.

* * * * *

UNITED STATES PATENT AND TRADEMARK OFFICE
CERTIFICATE OF CORRECTION

| PATENT NO. | : 7,960,249 B2 |
|---|---|
| APPLICATION NO. | : 12/553353 |
| DATED | : June 14, 2011 |
| INVENTOR(S) | : K. Kurita et al. |

It is certified that error appears in the above-identified patent and that said Letters Patent is hereby corrected as shown below:

| COLUMN | LINE | ERROR |
|---|---|---|
| 7 (Claim 1, | 27 line 1) | "a water" should read --a wafer-- |
| 7 (Claim 1, | 35 line 9) | "the water" should read --the wafer-- |
| 7 (Claim 2, | 43 lines 2-3) | "the other war." should read --the other wafer.-- |
| 8 (Claim 8, | 34 line 1) | "according to claim which" should read --according to claim 1 which-- |

Signed and Sealed this
Twenty-seventh Day of September, 2011

David J. Kappos
*Director of the United States Patent and Trademark Office*